(12) United States Patent
You et al.

(10) Patent No.: US 6,638,358 B1
(45) Date of Patent: Oct. 28, 2003

(54) METHOD AND SYSTEM FOR PROCESSING A SEMICONDUCTOR DEVICE

(75) Inventors: Lu You, Santa Clara, CA (US); Mark S. Chang, Los Altos, CA (US); Hao Fang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 23 days.

(21) Appl. No.: 09/483,176

(22) Filed: Jan. 13, 2000

(51) Int. Cl.[7] .......................... B05C 5/00; B05C 11/08; B05D 5/12; B05D 3/02; H01L 2/283
(52) U.S. Cl. ..................... 118/320; 118/66; 118/101; 118/300; 118/629; 427/96; 427/387; 438/623; 438/782; 438/787
(58) Field of Search .................... 118/101, 66, 723 VE, 118/724, 728, 730, 629, 630, 218, 300, 319, 320; 427/96, 98, 387; 528/26, 38, 12; 438/623, 780, 781, 782, 787

(56) References Cited

U.S. PATENT DOCUMENTS

| 5,451,655 | A | * | 9/1995 | Linde et al. | 528/76 |
|---|---|---|---|---|---|
| 5,472,488 | A | * | 12/1995 | Allman | 106/287.16 |
| 5,548,159 | A | * | 8/1996 | Jeng | 257/634 |
| 5,858,871 | A | * | 1/1999 | Jeng | 438/623 |
| 5,932,676 | A | * | 8/1999 | Taguchi et al. | 528/12 |
| 5,940,734 | A | * | 8/1999 | Inoue | 438/781 |
| 5,955,200 | A | * | 9/1999 | Chang et al. | 428/426 |
| 5,981,354 | A | * | 11/1999 | Spikes et al. | 438/424 |
| 6,022,814 | A | * | 2/2000 | Mikoshiba et al. | 438/789 |
| 6,114,186 | A | * | 9/2000 | Jeng et al. | 438/62.3 |

* cited by examiner

*Primary Examiner*—J. A. Lorengo
(74) *Attorney, Agent, or Firm*—Winstead Sechrest & Minick P.C.

(57) ABSTRACT

The present invention is a method and system for processing a semiconductor device, the semiconductor device comprising at least two gate stacks and a spacer gap. The method and system comprise utilizing a spin-on technique at the transistor device level to provide an oxide spacer in the spacer gap and then curing the semiconductor device at a temperature above approximately 450° C. Through the use of a system/method in accordance with the present invention, the voids that are created in the spacer gaps during conventional semiconductor processing are eliminated. Furthermore, the oxide spacers posses the high quality characteristics that are typically provided through the use of the conventional CVD methodology. Accordingly, as a result of the use of the system/method in accordance with the present invention, the MOSFET oxide spacers are strengthened, which increases the reliability of the semiconductor device.

3 Claims, 3 Drawing Sheets

METHOD AND SYSTEM FOR PROCESSING A SEMICONDUCTOR DEVICE

FIELD OF INVENTION

The present invention relates generally to semiconductor devices and more specifically to a method and system for eliminating the number of voids in semiconductor devices.

BACKGROUND OF THE INVENTION

Semiconductor manufacturers have increasingly turned to high density Metal Oxide Semiconductor (MOS) arrays in their integrated circuit design schemes. To achieve a high density integrated circuit, features such as metal-oxide semiconductor field-effect transistors (MOSFETs) must be as small as possible. Typically, high density flash memory integrated circuits utilize NAND-type gates as opposed to NOR-type gates since NAND gates have a considerably higher density than NOR gates. Smaller transistors allow more transistors to be placed on a single substrate, thereby allowing relatively large circuit systems to be incorporated on a single, relatively small die area. FIG. 1 illustrates a cross section of two conventional MOSFET cells. The cells 100 and 150 are comprised of gate stacks 102, 106 on a substrate 108. The gate stacks 102, 106 are separated by a spacer gap 104. To prevent charge leakage, oxide spacers 110 are formed on each side of the gate stacks 102, 106. These oxide spacers are typically formed using a conventional high temperature chemical vapor deposition (CVD) methodology or a spin-on technique.

The CVD methodology is typically utilized because of its high quality (good thickness uniformity, high purity and density, high degree of structural perfection, etc.) However, as dimensions are reduced in each new generation of integrated circuit, it becomes more difficult to deposit oxide material utilizing the conventional high temperature CVD methodology. For example, as a result of the reduced dimensions, the spacer gaps are smaller (0.32 microns or lower), therefore the formation of voids during the CVD process becomes a more significant concern. Voids create weaknesses in the oxide spacers 110 which reduces the reliability of the device. Furthermore, utilizing a conventional spin-on methodology produces substantially void free oxide spacers, but conventional spin-on methodology is not utilized at the transistor device level.

Accordingly, what is needed is a method for eliminating voids in the oxide spacers of the spacer gaps of semiconductor devices while maintaining the high quality provided through the use of the CVD methodology. The present invention addresses such a need.

SUMMARY OF THE INVENTION

The present invention is a method and system for processing a semiconductor device, the semiconductor device comprising at least two gate stacks and a spacer gap. The method and system comprise utilizing a spin-on technique at the transistor device level to provide an oxide spacer in the spacer gap and then curing the semiconductor device at a temperature above approximately 450° C.

Through the use of a system/method in accordance with the present invention, the voids that are created in the core spacer gaps during conventional semiconductor processing are eliminated. Furthermore, the oxide spacers possess the high quality characteristics that are typically provided through the use of the conventional CVD methodology. Accordingly, as a result of the use of the system/method in accordance with the present invention, the MOSFET oxide spacers are strengthened, which increases the reliability of the semiconductor device.

DETAILED DESCRIPTION OF THE INVENTION

The present invention provides a method and system for processing a semiconductor. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiments shown but is to be accorded the widest scope consistent with the principles and features described herein.

The method and system in accordance with the present invention is described in the context of a preferred embodiment. The preferred embodiment utilizes a spin-on technique at the transistor device level to provide an oxide layer, instead of the conventional high temperature chemical vapor deposition technique, followed by a high temperature cure. Through the use of a system/method in accordance with the present invention, the voids that are created in the spacer gaps during conventional semiconductor processing are eliminated. Furthermore, the oxide spacers posses the high quality characteristics that are typically provided through the use of the conventional CVD methodology. Accordingly, as a result of the use of the system/method in accordance with the present invention, the MOSFET oxide spacers are strengthened, which increases the reliability of the semiconductor device.

Figure 1:
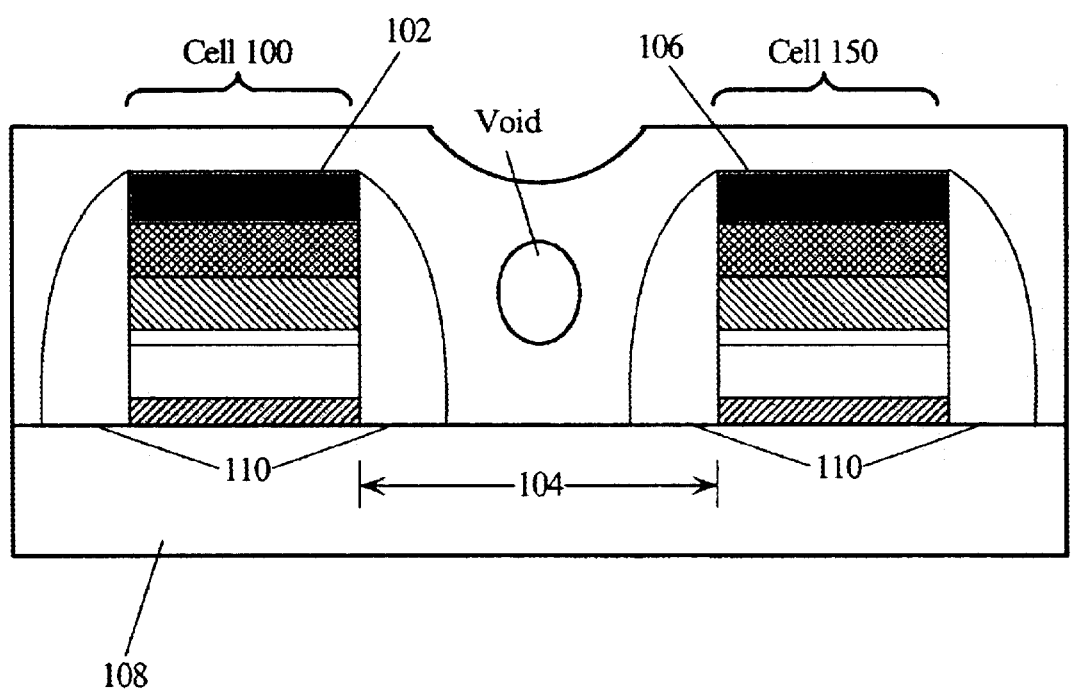
FIG. 1 is a cross section of two conventional MOSFET cells.
Figure 2:
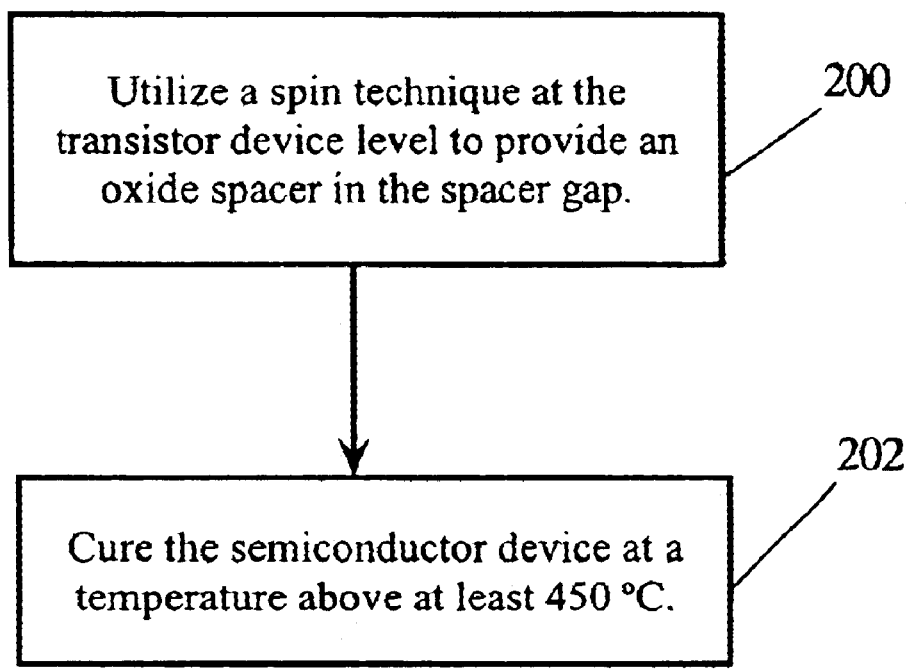
FIG. 2 is a high level flowchart of the method in accordance with the present invention.

To further describe the method in accordance with the present invention, refer now to FIG. 2. FIG. 2 is a high-level flowchart of the method in accordance with the present invention. First, a spin-on technique is utilized at the transistor device level to provide an oxide spacer in the spacer gap, via step 200. Next, the semiconductor device is cured at a temperature above approximately 450° C., via step 202.

As previously stated, in accordance with the present invention a spin-on technique is preferably utilized to provide oxide spacers between the gate stacks in a semiconductor device. Spin-on dopants are liquid solutions which, upon drying form doped silicon oxide-like layers. A spin-on dopant is preferably applied to the substrate by spin coating. This procedure is carried out by dispensing the dopant onto the substrate and then rapidly spinning the wafer until the dopant is essentially dry. The thickness of the deposit depends on the solution viscosity and the spin speed. The dopant concentration in the film can be varied by dilution with organic solvents (e.g. ethyl alcohol).

Preferably, the spin-on dopant is either a spin-on glass (SOG) material or a hydrogen silsesquiloxane (HSQ) resin. SOG materials are siloxanes and silicates mixed in alcohol-based solvents. HSQ resins are relatively carbon free, thereby rendering it unnecessary to etch back HSQ below the upper surface of the metal lines to avoid shorting. In addition, HSQ exhibits excellent planarity and is capable of gap filling spacings less than 0.15 microns employing conventional spin-on equipment.

Although the preferred embodiment of present invention contemplates the use of a SOG or HSQ spin-on dopant, one of ordinary skill in the art will readily recognize that a variety of spin-on dopants could be used while remaining within the spirit and scope of the present invention.

Once the spin-on dopants have been applied, the device must be cured to drive off the residue solvents that are present in the dopants and also to enhance the material properties of the dopants. Conventional methodology employs a cure temperature of around 400–450° C. This will produce substantially void free oxide spacers, but the spacers will not posses high quality characteristics. However, the preferred embodiment of the method in accordance with the present invention, employs a high temperature cure wherein the cure temperature is approximately 750° C. or above. This is preferably accomplished by utilizing a rapid thermal annealing process or a furnace process. The high temperature cure converts the SOG/HSQ to a higher quality oxide spacer than could be achieved by curing at a lower temperature. Accordingly, because of the higher cure temperature the oxide spacer is not only substantially void free, but it also possesses a CVD-type quality. This is essential when filling the smaller spacer gaps present in high density circuits.

Figure 3:
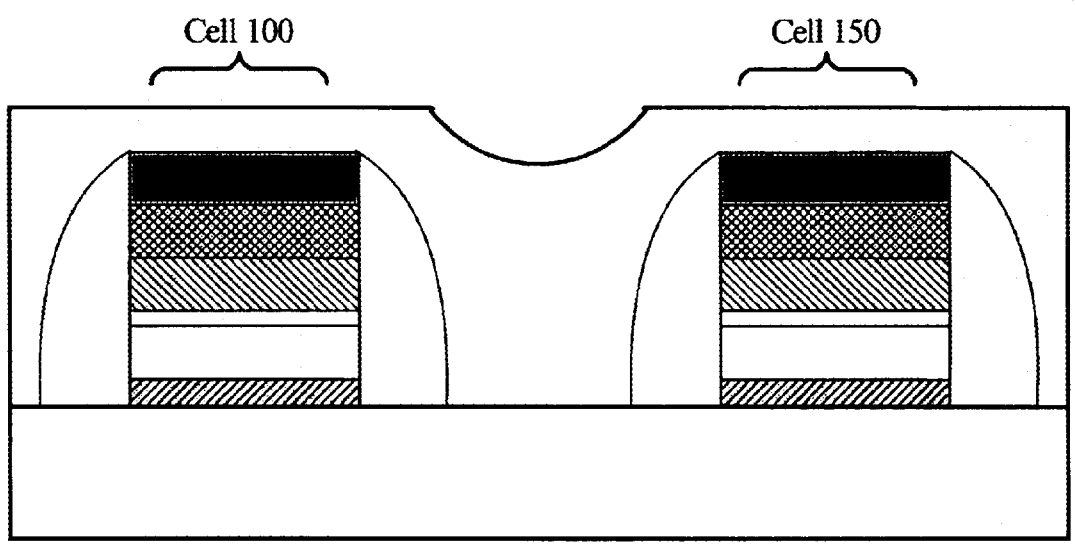
FIG. 3 is a MOSFET cell configuration in accordance with the present invention.

FIG. 3 illustrates a MOSFET configuration in accordance with the present invention. As is shown, cells 100' and 150' are comprised of gate stacks 102', 106' on a substrate 108'. The gate stacks 102', 106' are separated by a spacer gap 104'. In accordance with the present invention, the spacer gap 104' is void free. Thus, the quality of oxide spacers 110' is improved, along with the reliability of the device.

Through the use of a system/method in accordance with the present invention, the voids that are created in the spacer gaps during conventional semiconductor processing are eliminated. Furthermore, the oxide spacers possess the high quality characteristics that are typically provided through the use of the conventional CVD methodology. Accordingly, as a result of the use of the system/method in accordance with the present invention, the MOSFET oxide spacers are strengthened, which increases the reliability of the semiconductor device.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for processing a semiconductor device, the semiconductor device comprising at least two gate stacks and a spacer gap, the system comprising:

a spin-on technique system for providing an insulating layer in the spacer gap, wherein a chemical vapor deposition process is not utilized to provide the insulating layer; and means for utilizing a rapid thermal annealing process to cure the semiconductor device at temperature of at least 750° C.

2. The system of claim 1 wherein the spin-on technique utilizes a spin-on glass material.

3. The system of claim 1 wherein the spin-on technique utilizes a hydrogen silsesquiloxane resin.

* * * * *

UNITED STATES PATENT AND TRADEMARK OFFICE
CERTIFICATE OF CORRECTION

PATENT NO. : 6,638,358 B1
DATED : October 28, 2003
INVENTOR(S) : Lu You, Mark S. Chang and Hao Fang It is certified that error appears in the above-identified patent and that said Letters Patent is hereby corrected as shown below:

Column 4,
Line 28, before "temperature" please insert -- a --.

Signed and Sealed this

Twenty-fifth Day of May, 2004

JON W. DUDAS
*Acting Director of the United States Patent and Trademark Office*